United States Patent
Egerer et al.

(10) Patent No.: US 7,425,861 B2
(45) Date of Patent: Sep. 16, 2008

(54) DEVICE AND METHOD FOR REGULATING THE THRESHOLD VOLTAGE OF A TRANSISTOR

(75) Inventors: Jens Egerer, Kirchheim (DE); Rainer Bartenschlager, Kaufbeuren (DE); Helmut Schneider, München (DE)

(73) Assignee: Qimonda AG, Munich (DE)

( * ) Notice: Subject to any disclaimer, the term of this patent is extended or adjusted under 35 U.S.C. 154(b) by 43 days.

(21) Appl. No.: 11/477,077

(22) Filed: Jun. 28, 2006

(65) Prior Publication Data

US 2007/0008796 A1    Jan. 11, 2007

(51) Int. Cl.
*G05F 1/10* (2006.01)
(52) U.S. Cl. ....................................... 327/534
(58) Field of Classification Search ................. 327/513, 327/534, 535, 536, 537
See application file for complete search history.

(56) References Cited

U.S. PATENT DOCUMENTS

| | | | | |
|---|---|---|---|---|
| 5,394,026 A * | 2/1995 | Yu et al. | ..................... | 327/536 |
| 6,087,892 A * | 7/2000 | Burr | ........................... | 327/534 |
| 6,147,508 A * | 11/2000 | Beck et al. | ..................... | 326/32 |
| 6,373,323 B2 * | 4/2002 | Kuroda | ........................ | 327/536 |
| 6,529,421 B1 * | 3/2003 | Marr et al. | ............. | 365/189.09 |
| 6,765,428 B2 * | 7/2004 | Kim et al. | .................... | 327/534 |
| 6,903,599 B2 * | 6/2005 | Chen et al. | .................. | 327/536 |
| 6,917,237 B1 * | 7/2005 | Tschanz et al. | ............. | 327/513 |
| 6,927,621 B2 * | 8/2005 | Yamada | ...................... | 327/537 |
| 6,943,613 B2 * | 9/2005 | Miyazaki et al. | ............ | 327/534 |
| 2003/0076701 A1 | 4/2003 | Fetzer | | |

FOREIGN PATENT DOCUMENTS

DE    43 00 826 A1    1/1994

* cited by examiner

*Primary Examiner*—Jeffrey S Zweizig
(74) *Attorney, Agent, or Firm*—Dicke, Billig & Czaja, PLLC

(57) ABSTRACT

A method and a device for regulating the threshold voltage of a transistor is disclosed. The device includes a circuit configured for modifying a voltage applied at a bulk connection of the transistor such that the threshold voltage of the transistor is substantially temperature-independent at least in a first temperature range. In one embodiment, the device includes a memory device, and the transistor is a transistor of a sense amplifier of the memory device.

26 Claims, 4 Drawing Sheets

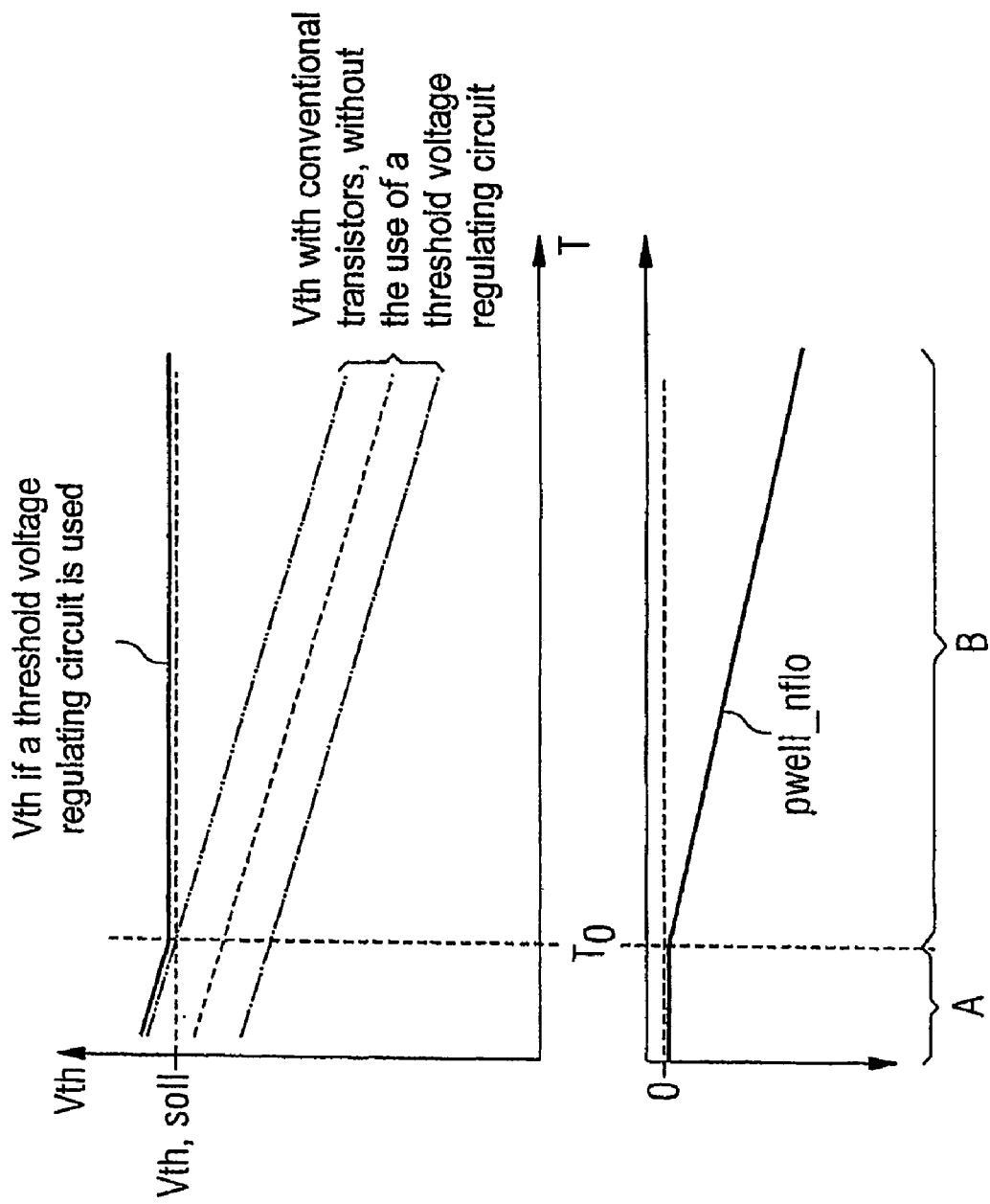

DEVICE AND METHOD FOR REGULATING THE THRESHOLD VOLTAGE OF A TRANSISTOR

CROSS-REFERENCE TO RELATED APPLICATIONS

This Utility Patent Application claims priority to German Patent Application No. DE 10 2005 030 372.2 filed on Jun. 29, 2005, which is incorporated herein by reference.

FIELD OF THE INVENTION

The invention relates to a device and a method for regulating the threshold voltage of a transistor, for example, of a transistor of a sense amplifier of a semiconductor memory device.

BACKGROUND

In the case of semiconductor memory devices, one differentiates between functional memory devices (e.g., PLAs, PALs, etc.), and table memory devices, e.g., ROM devices (ROM=Read Only Memory), and RAM devices (RAM=Random Access Memory or read write memory).

A RAM device is a memory for storing data under a predetermined address and for reading out the data under this address again later.

The corresponding address can be input into the RAM device via address pins or address input pins, respectively. For the input and the output of the data, a plurality of e.g., 16, data pins or data input/output pins (I/Os or inputs/outputs) are provided. By applying an appropriate signal (e.g., a read/write signal) at a write/read selection pin there may be selected whether data are to be stored or to be read out (at the moment).

Since as many memory cells as possible are to be accommodated in a RAM device, one has been trying to realize them as simple as possible. In the case of SRAMs (SRAM=Static Random Access Memory), the individual memory cells consist, e.g., of few, for instance 6, transistors, and in the case of DRAMs (DRAM=Dynamic Random Access Memory) in general only of one single, correspondingly controlled capacitor with the capacitance of which one bit each can be stored as charge. This charge, however, remains for a short time only. Therefore, a "refresh" must be performed regularly, e.g., approximately every 64 ms.

For technological reasons, the individual memory cells are, in the case of memory devices, in particular DRAM devices, arranged side by side in a plurality of rows and columns in a rectangular matrix (that is regularly subdivided into a plurality of cell fields) or a rectangular array (that is regularly subdivided into a plurality of cell fields), respectively.

In order to achieve a correspondingly high overall storage capacity and/or a data read or write rate that is as high as possible, instead of one single array, a plurality of, e.g., four—substantially rectangular—individual arrays may be provided in an individual RAM device or chip (e.g., a multi-bank chip) ( "memory banks").

To perform a write or read access, a particular, predetermined sequence of commands has to be run through:

By means of a word line activate command (activate command (ACT)), a corresponding word line—that is, in particular, assigned to a particular array—(and that is defined by the row address ("row address") is, for instance, activated first of all.

This results in that the data values stored in the memory cells that are assigned to the corresponding word line are read out by the sense amplifiers that are assigned to the corresponding word line ("activated state" of the word line).

Subsequently—by means of a corresponding read or write command (Read (RD) or Write (WT) command)—it is initiated that the corresponding data—that are then exactly specified by the corresponding column address ("column address")—are correspondingly output by the corresponding sense amplifier(s) that is/are assigned to the bit line specified by the column address ("column address") (or—vice versa—the data are read into the corresponding memory cells).

Next—by means of a word line deactivate command (e.g., a precharge command (PRE command))—the corresponding word line is deactivated again, and the corresponding array is prepared for the next word line activate command (activate command (ACT)).

The above-mentioned sense amplifiers are each arranged in a sense amplifier region positioned between two cell fields, wherein—for reasons of space—one and the same sense amplifier may be assigned to two different cell fields (namely to the two cell fields that are directly adjacent to the corresponding sense amplifier region) ("shared sense amplifier").

Depending on whether data are to be read out from the cell field positioned at the left or at the right next to the respective sense amplifier (or from the cell field positioned above or below the respective sense amplifier), the corresponding sense amplifier is switched to the corresponding cell field (in particular to the corresponding bit line assigned to the respective cell field) by means of appropriate switches (or is electrically connected with the corresponding cell field, in particular the corresponding bit line assigned to the respective cell field), or switched off the corresponding cell field (or the corresponding bit line assigned to the respective cell field) (or electrically disconnected from the corresponding cell field (or the corresponding bit line assigned to the respective cell field)).

The threshold voltages (Vth) of transistors, in particular of field effect transistors—and thus also the threshold voltages of field effect transistors used in sense amplifiers—are temperature-dependent.

In the case of field effect transistors with a relatively low threshold voltage (Vth), the range of the threshold voltage may be in the same magnitude as the threshold voltage itself.

The threshold voltage (Vth) determines—substantially—the behavior of a field effect transistor in a circuit. One reason therefor is, for instance, that field effect transistors often are to be operated in the activated region in which the gate source voltage (Vgs) has to be higher than the threshold voltage (Vth), or often also in the saturation region (wherein the drain source voltage (Vds) has to be higher than the saturation voltage (Vdsat, with Vdsat=Vgs−Vth).

It would therefore be desirable if the threshold voltage (Vth) were—other than indicated above—temperature-independent or largely temperature-independent.

In particular circuits, especially, e.g., in field effect transistors used in the above-mentioned sense amplifiers, there occurs the problem that it has to be ensured that the respective transistor threshold voltage (Vth) does not fall below a minimum value even at relatively high temperatures (e.g., to avoid the occurrence of leaking currents). This entails the risk that—vice versa—in the case of relatively low temperatures the threshold voltage (Vth) becomes so high that the operability of the respective circuit is no longer guaranteed.

For these and other reasons, there is a need for the present invention.

SUMMARY

The invention relates to a method and a device for regulating the threshold voltage of a transistor. In one embodiment, the device includes means for modifying a voltage applied at a bulk connection of the transistor such that the threshold voltage of the transistor is substantially temperature-independent at least in a first temperature range.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a schematic representation of threshold voltage Vth resulting at different temperatures T if the threshold voltage regulating circuit illustrated in FIG. 3 is used, compared to threshold voltages Vth resulting without a threshold voltage regulating circuit, as well as of the bulk connection voltage pwell_nflo resulting at different temperatures T.

DETAILED DESCRIPTION

Figure 1:
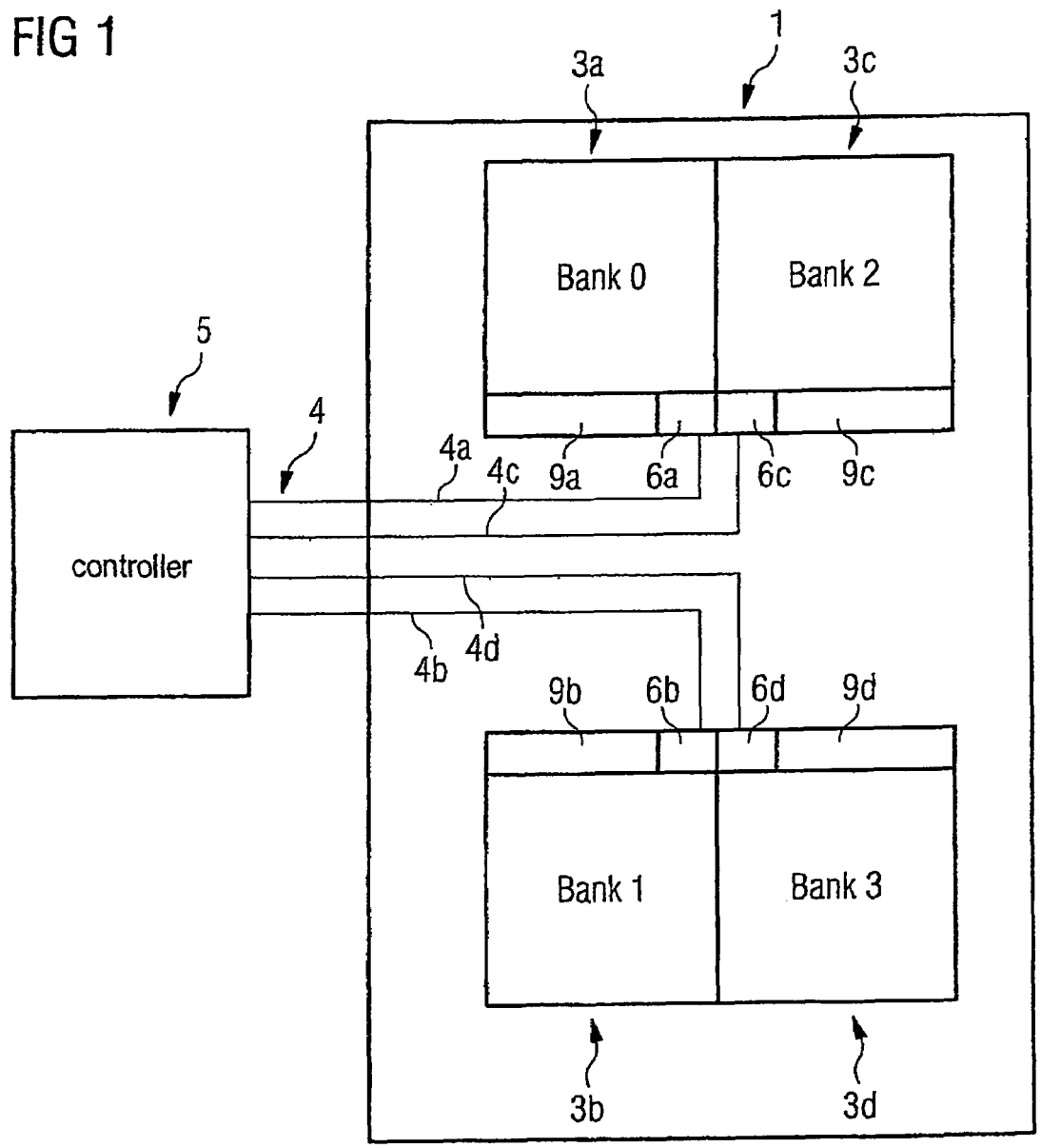
FIG. 1 illustrates a schematic representation of the structure of a semiconductor memory device with a plurality of arrays, and of a memory device controller.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a novel device for regulating the threshold voltage of a transistor, and a method for regulating the threshold voltage of a transistor, in particular a device and a method in which the temperature-dependency of the transistor threshold voltage is reduced.

In accordance with a first embodiment of the invention there is provided a device for regulating the threshold voltage (Vth) of a transistor, wherein the device comprises means for modifying the voltage applied at a bulk connection of the transistor.

The means is configured such that, by modifying the voltage applied at the bulk connection of the transistor (in particular by modifying the voltage applied at the bulk connection as a function of the temperature) the threshold voltage (Vth) of the transistor is—at least in a first temperature range—substantially temperature-independent.

To express it differently, modifications of the threshold voltage that are caused by temperature fluctuations are compensated by—opposite—modifications of the threshold voltage that are based on the "bulk effect". Thus it is achieved that the transistor all in all behaves distinctly less temperature-dependent than without a regulation of the threshold voltage (Vth).

In accordance with a further embodiment of the invention there is provided a method for regulating the threshold voltage (Vth) of a transistor, wherein the method includes:

Modifying a voltage applied at a bulk connection of the transistor such that the threshold voltage (Vth) of the transistor is substantially temperature-independent at least in a first temperature range.

The method additionally includes comparing a gate source voltage of a transistor that is connected as a diode with a reference voltage.

A charge pump is activated or deactivated, depending on the result of the comparison of the gate source voltage with the reference voltage. A voltage applied at a bulk connection of the transistor that is connected as a diode is modified by means of a charge pump.

In one embodiment, the voltage applied at the bulk connection of the transistor that is to be regulated—to a constant threshold voltage—is simultaneously modified by the charge pump.

FIG. 1 illustrates a schematic representation of the structure of a semiconductor memory device 1 or a semiconductor memory chip, respectively, and of a—central—memory device controller 5.

The semiconductor memory device 1 may, for instance, be a table memory device based on CMOS technology, e.g., a RAM memory device (RAM =Random Access Memory or read write memory), in particular a DRAM memory device (DRAM=Dynamic Random Access Memory or dynamic read write memory).

With the semiconductor memory device 1 data may—after the input of a corresponding address (e.g., by the memory device controller 5)—be stored under the respective address and be read out again under this address later.

The address may be input in several, e.g., two, successive steps (e.g., firstly a row address ("row address")—and possibly parts of a column address ("column address") (and/or possibly further address parts, or parts thereof)—, and then the column address ("column address") (or the remaining parts of the column address ("column address"), and/or—only now—the above-mentioned further address parts (or the remaining parts thereof)).

By applying an appropriate control signal (e.g., a read/write signal)—e.g., by the memory device controller 5—there may be selected whether data are to be stored or to be read out.

The data input into the semiconductor memory device 1 are, as will be explained in more detail in the following, stored in corresponding memory cells there and are read out again from the corresponding memory cells later, wherein the signals generated during the reading out of the data are amplified by corresponding sense amplifiers.

Each memory cell consists, e.g., of few elements, in particular of only one single, correspondingly controlled capacitor with the capacitance of which one bit each can be stored as charge.

As results from FIG. 1, a particular number of memory cells each is positioned—side by side in a plurality of rows and columns—in a rectangular or square array ("memory bank") 3a, 3b, 3c, 3d, so that—corresponding to the number of memory cells contained—, e.g., 32 MBit, 64 MBit, 128 MBit, 256 MBit, etc. each can be stored in an array 3a, 3b, 3c, 3d.

As is further illustrated in FIG. 1, the semiconductor memory device 1 comprises a plurality of, e.g., four, memory cell arrays 3a, 3b, 3c, 3d (here: the memory banks 0-3) that are each of substantially identical structure, are distributed evenly over the area of the device, and are controlled by the above-mentioned memory device controller 5 substantially independently of each other, so that correspondingly a total storage capacity of, e.g., 128 MBit, 256 MBit, 512 MBit, or 1024 MBit (or 1 GBit) results for the semiconductor memory device 1.

By the providing of a plurality of substantially independent arrays 3a, 3b, 3c, 3d it can be achieved that—in parallel or overlapping in time—corresponding write or read accesses may be performed in several, different arrays 3a, 3b, 3c, 3d.

The above-mentioned address (input into the semiconductor memory device 1 or the memory device controller 5, respectively) comprises—as part of the above-mentioned further address parts—a corresponding number of (here, e.g., two) bits ("array selection bits" or "bank address bits") serving to address the respectively desired array 3a, 3b, 3c, 3d during the storing or reading out of data.

Figure 2:
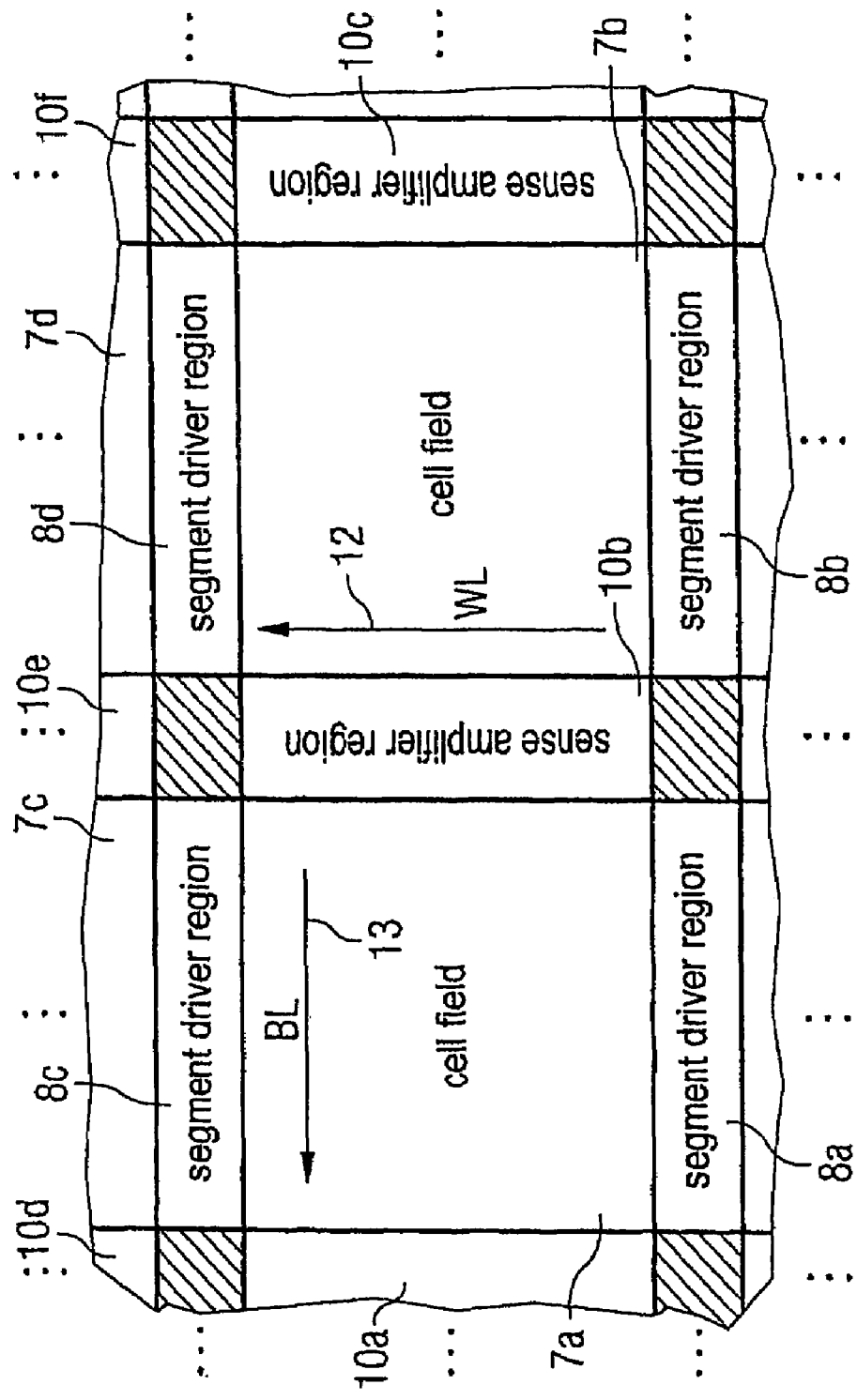
FIG. 2 illustrates a schematic detail representation of the structure of a section of one of the arrays of the semiconductor memory device illustrated in FIG. 1.

As will be explained in more detail in the following, the above-mentioned memory cells are positioned in the arrays 3a, 3b, 3c, 3d each in corresponding cell fields or cell field regions 7a, 7b, 7c, 7d—that are positioned vertically on top of each other or horizontally side by side—(cf., e.g., the cell field regions 7a, 7b, 7c, 7d that are illustrated by way of example in FIG. 2, as well as a plurality of further—not illustrated—cell field regions positioned at the right or at the left, and above or below the cell field regions 7a, 7b, 7c, 7d in the representation of FIG. 2).

The cell field regions 7a, 7b, 7c, 7d are each of substantially identical structure, are substantially of rectangular (or, e.g., square) design, and each comprise a particular number of memory cells that are each positioned side by side in a plurality of rows and columns.

Between two respective cell fields 7a, 7b, 7c, 7d (or—in the representation according to FIG. 2—each at the left or at the right of a cell field 7a, 7b, 7c, 7d) there are positioned—here also substantially rectangular—sense amplifier regions 10a, 10b, 10c, 10d, 10e, 10f (and—between the sense amplifier regions 10a, 10b, 10c, 10d, 10e, 10f—corresponding segment driver regions 8a, 8b, 8c, 8d).

In each of the sense amplifier regions 10a, 10b, 10c, 10d, 10e, 10f there are respectively arranged a plurality of sense amplifiers, wherein the corresponding sense amplifiers (or more exactly: the sense amplifiers arranged in the respective sense amplifier regions 10a, 10b, 10c, 10d, 10e, 10f positioned between two different cell fields 7a, 7b, 7c, 7d) are respectively assigned to two different cell fields 7a, 7b, 7c, 7d (namely the respective cell fields 7a, 7b, etc. that are directly adjacent to the corresponding sense amplifier region—, e.g., the sense amplifier region 10b); in the present embodiments, "shared sense amplifiers" are thus used.

Figure 3:
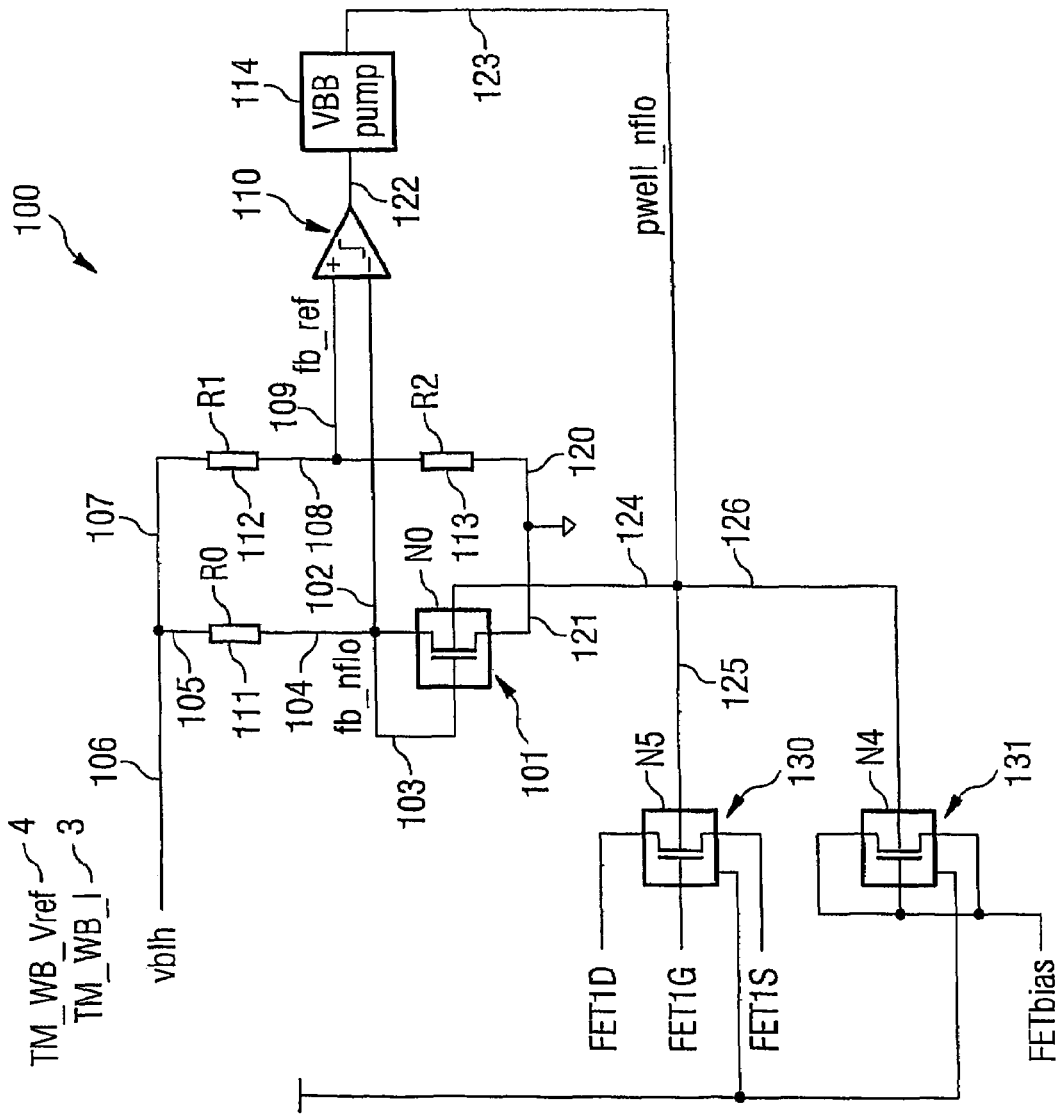
FIG. 3 illustrates a schematic representation of a threshold voltage regulating circuit used with the semiconductor memory device illustrated in FIG. 1 and in FIG. 2, according to an embodiment of the present invention.

To reduce the temperature-dependency of the threshold voltage (Vth) of one or a plurality of the transistors, in particular field effect transistors, used in one or a plurality of the above-mentioned sense amplifiers (here: corresponding MOSFET transistors (e.g., the n-channel MOSFET transistors 130, 131 (transistors N5, N4) illustrated by way of example in FIG. 3), the threshold voltage regulating circuit 100 that will be explained in detail in the following by means of FIG. 3 is used in the present embodiment.

The threshold voltage regulating circuit 100 illustrated in FIG. 3 (or a threshold voltage regulating circuit structured and/or operating correspondingly similar to the threshold voltage regulating circuit 100) may alternatively, instead for one or a plurality of field effect transistors used in the above-mentioned sense amplifiers, also be used for one or a plurality of field effect transistors of any different kind of sense amplifiers, and/or for one or a plurality of field effect transistors, in particular MOSFET transistors, of any other circuits for which the temperature-dependency of the threshold voltage (Vth) is to be reduced correspondingly.

In particular can the threshold voltage regulating circuit 100 be used for one or a plurality of field effect transistors in which the substrate or bulk connections are each designed as electrically insulated local connections that are not connected with a global substrate connection of the respective device.

The threshold voltage regulating circuit 100 is—as results from FIG. 3—based on a bridge circuit having a transistor 101 that is connected as a diode, in particular a MOS diode (here: an n-channel MOSFET transistor N0).

The n-channel MOSFET transistor 101 comprises—corresponding to conventional n-channel MOSFET transistors—four different connections, namely a drain, a source, a gate and a substrate or bulk connection.

The gate connection of the n-channel MOSFET transistor 101 is connected with the drain connection of the n-channel MOSFET transistor 101 via a line 103. The gate connection and the drain connection of the n-channel MOSFET transistor 101 are connected to a resistor 111 (resistor R0) via a line 104, and to a minus input of a comparator 110 via a line 102, so that the voltage Vgs (here: the voltage fb_nflo) present between the gate connection and the source connection of the n-channel MOSFET transistor 101 is fed to the minus input of the comparator 110.

The resistor 111 is connected—via a line 105 and a line 106 connected therewith—with a—substantially constant—supply voltage (here: vblh).

As results further from FIG. 3, the above-mentioned supply voltage vblh—that is present at the line 106—is fed—via a line 107—to a voltage divider formed of a resistor 112 (resistor R1) and a resistor 113 (resistor R2) that is connected with the resistor 112 via a line 108.

The voltage (reference voltage fb_ref) present between the resistors 112, 113 is fed to a plus input of the comparator 110 via a line 109.

The output of the comparator 110 is connected to the input of a charge pump 114 via a line 122.

The output of the charge pump 114 is connected with the bulk or substrate connection of the n-channel MOSFET transistor 101 via a line 123 and a line 124 connected therewith.

In addition to this, the output of the charge pump 114 is, via the above-mentioned line 123 and a line 125, connected with the substrate or bulk connection of the n-channel MOSFET transistor 130 (at which—as explained above—the temperature-dependency of the threshold voltage (Vth) is to be reduced), and—via the above-mentioned line 123 and a line 126—with the substrate or bulk connection of the n-channel MOSFET transistor 131 (at which—as explained above—the temperature dependency of the threshold voltage (Vth) also is to be reduced) (and/or—as explained above—with one or a plurality of further substrate or bulk connections of one or a plurality of further transistors at which the threshold voltage (Vth) is to be regulated).

As results further from FIG. 3, the resistor 113 (or the above-mentioned voltage divider formed by the resistors 113 and 112, respectively), is connected to ground via a line 120.

Correspondingly similar, the source connection of the n-channel MOSFET transistor 101 is also connected to ground (here: via a line 121).

In the comparator 110, the reference voltage fb_ref present between the resistors 112, 113 and fed to the plus input of the comparator 110 via the line 109 is compared with the voltage fb_nflo present between the gate connection and the source connection of the n-channel MOSFET transistor 101 and fed to the minus input of the comparator 110 via the line 102.

If the voltage fb_nflo present at the line 109 is lower than the voltage fb_ref present at the line 108, the comparator 110 outputs a logic high signal ("1") at its output (i.e. the above-mentioned line 122).

If, contrary to this, the voltage fb_nflo present at the line 109 is higher than the voltage fb_ref present at the line 108, the comparator 110 outputs a logic low signal ("0") at its output (i.e. the above-mentioned line 122).

If the above-mentioned logic high signal ("1") is present at the line 122 (i.e. at the input of the charge pump 114), the charge pump 114 is activated, and thus—via the above-mentioned lines 123, 124 (and 125, 126)—a voltage present at the substrate or bulk connection of the n-channel MOSFET transistor 101 (voltage pwell_nflo)—and simultaneously a voltage present at the substrate or bulk connection of the n-channel MOSFET transistors 130, 131—is pumped towards ever more negative voltages by the charge delivered by the charge pump 114 until—due to the increase in the gate source voltage fb_nflo of the n-channel MOSFET transistor 101 effected thereby—the voltage fb_nflo fed to the minus input of the comparator 110 is somewhat higher than the reference voltage fb_ref fed to the plus input of the comparator 110.

Due to the logic low signal ("0") that is then output by the comparator 110 at the line 122 (i.e. at the input of the charge pump 114), the charge pump 114 is deactivated (i.e. no more charge is pumped by the charge pump 114 to the bulk connection of the n-channel MOSFET transistor 101).

The voltage (voltage pwell_nflo) present at the substrate or bulk connection of the n-channel MOSFET transistor 101—and thus simultaneously the voltage present at the substrate or bulk connection of the n-channel MOSFET transistors 130, 131—is then slowly drawn towards 0V again (e.g., by a highly resistive transistor—that is not illustrated here and that is provided additionally—and/or by switching activities at the above-mentioned, connected transistors, etc.).

This results in that the gate source voltage fb_nflo of the n-channel MOSFET transistor 101 decreases again, so that—when the voltage fb_nflo fed to the minus input of the comparator 110 gets lower than the reference voltage fb_ref fed to the plus input of the comparator 110—the comparator 110 again outputs a logic high signal ("1") at the line 122 (i.e. at the input of the charge pump 114), the charge pump 114 is activated, and thus—via the above-mentioned lines 123, 124, 125, 126—the voltage pwell_nflo present at the substrate or bulk connection of the n-channel MOSFET transistor 101—and simultaneously the voltage present at the substrate or bulk connection of the n-channel MOSFET transistors 130, 131—is pumped towards a more negative voltage by the charge pump 114, etc.

The voltage pwell_nflo present at the substrate or bulk connection of the n-channel MOSFET transistor 101 is thus regulated such that the gate source voltage fb_nflo of the n-channel MOSFET transistor 101 is always approximately equal to the reference voltage fb_ref.

By the activating and deactivating of the charge pump 114 initiated in the above-mentioned manner it is achieved that the voltage pwell_nflo present at the substrate or bulk connection of the n-channel MOSFET transistor 101 assumes—as described above—corresponding negative values, and it is simultaneously avoided that the voltage pwell_nflo present at the substrate or bulk connection of the n-channel MOSFET transistor 101 can become positive.

Thus it can be ensured that the diode formed by the n-channel MOSFET transistor 101 is not placed in a through-connected state unintentionally (by too high a positive voltage at the substrate or bulk connection).

By means of the threshold voltage regulating circuit 100 illustrated in FIG. 3 it is achieved that—substantially independently of the temperature T—the threshold voltage Vth of the transistors controlled by the threshold voltage regulating circuit 100 (here: the n-channel MOSFET transistors 130, 131) is kept substantially constant (namely close to a predetermined desired value for the threshold voltage Vth,targ).

In a n-channel MOSFET transistor 101 connected as a diode in the above-described manner, the gate source voltage Vgs (here: the voltage fb_nflo) is approximately equal to the threshold voltage Vth.

The higher the temperature T, the lower is—due to the temperature dependency of the threshold voltage Vth of the transistor 101, and as illustrated in FIG. 4—the value to which the voltage pwell_nflo present at the substrate or bulk connection of the n-channel MOSFET transistor 101 (and thus the bulk voltage fed to the substrate or bulk connections of the n-channel MOSFET transistors 130, 131) is regulated in the above-described manner.

Vice versa—as is also illustrated in FIG. 4—the value to which the voltage pwell_nflo present at the substrate or bulk connection of the n-channel MOSFET transistor 101 (and thus the bulk voltage fed to the substrate or bulk connections of the n-channel MOSFET transistors 130, 131) is regulated in the above-described manner, is the higher the lower the temperature T is.

By means of the threshold voltage regulating circuit 100, the bulk voltage fed to the substrate or bulk connections of the n-channel MOSFET transistors 130, 131 is thus—by utilizing the "bulk effect"—adjusted such that the threshold voltage Vth is kept constant over temperature. In other words, modifications of the threshold voltage Vth caused by temperature fluctuations are compensated by—opposite—modifications of the threshold voltage based on the "bulk effect" (cf. also the temperature range B illustrated in FIG. 4).

Only if, as is also illustrated in FIG. 4, the temperature T drops below a temperature T0, from which on positive values—which are here undesired for safety reasons—of the voltage pwell_nflo present at the substrate or bulk connection of the n-channel MOSFET transistor 101 would be required to achieve the above-mentioned threshold voltage desired value Vth,targ, does the threshold voltage Vth resulting for the n-channel MOSFET transistors 130, 131 increase above the above-mentioned threshold voltage desired value Vth,targ (cf. also the temperature range A illustrated in FIG. 4).

In the present embodiment, the resistance values of the resistors 112, 113 forming the above-mentioned voltage divider are configured to be step-wise adjusted variably in or prior to operation (but after the manufacturing of the above-mentioned semiconductor memory device 1):

The higher the value of a—here, e.g., 4 bit wide—control signal TM_WB_Vref input in the semiconductor memory device 1 (e.g., in a set-up mode of the semiconductor memory device 1) (cf. FIG. 3), the higher is the resistance value of the resistor 112, and the lower is the resistance value of the resistor 113 (or vice versa).

Thus, the intensity of the above-mentioned reference voltage fb_ref—provided by the voltage divider formed by the resistors 112, 113—can be adjusted (in particular such that it corresponds approximately to the above-mentioned predetermined desired value for the threshold voltage Vth,targ, or to the gate source voltage Vgs, respectively).

Advantageously, the resistance values of the resistors 112, 113 are adjusted such that, for the above-mentioned temperature T0 (and thus also for temperatures above the temperature T0) (i.e. with the temperature range B illustrated in FIG. 4), the voltage pwell_nflo present at the substrate or bulk connection of the n-channel MOSFET transistor 101 is regulated such by the threshold voltage regulating circuit 100 illustrated in FIG. 3 that the threshold voltage Vth resulting for the transistors 130, 131 corresponds to the above-mentioned threshold voltage desired value Vth,targ, and that the value of the voltage pwell_nflo present at the substrate or bulk connection of the n-channel MOSFET transistor 101 is approximately equal to Zero at the temperature T0 (wherein the temperature T0 ranges below the temperature that is minimally admissible for the semiconductor memory device 1).

The above-mentioned threshold voltage desired value Vth, targ is usually indicated for a specific intensity of the drain source current during the characterization of the transistors 130, 131.

In the present embodiment—correspondingly similar as with the resistors 112, 113 forming the above-mentioned voltage divider—the resistance value of the resistor 111 that is connected in series to the n-channel MOSFET transistor 101 is also configured to be step-wise adjusted variably in or prior to operation (but after the manufacturing of the above-mentioned memory device 1):

The higher the value of a—here, e.g., 3 bit wide—control signal TM_WB_I input into the semiconductor memory device 1 (e.g., in a set-up mode of the semiconductor memory device 1) (cf. FIG. 3), the higher is the resistance value of the resistor 111 (or vice versa).

Thus, the intensity of the current flowing through the resistor 111 and the n-channel MOSFET transistor 113 can be adjusted (in particular, e.g., such that it corresponds approximately to the intensity of the drain source current used for characterizing the transistors 130, 131).

Thus, inaccuracies caused by technology fluctuations may be compensated for; alternatively or additionally, corresponding test or analysis methods may also be performed—by an intentional modification of the resistance value of the resistor 111 (e.g., for checking the robustness of the circuit, etc.).

In a—not illustrated—variant of the threshold voltage regulating circuit 100 illustrated in FIG. 3, the gate connection of the n-channel MOSFET transistor 101 is—other than illustrated in FIG. 3—not connected with the drain connection of the n-channel MOSFET transistor 101, but—instead—via a not illustrated line with a—substantially constant—voltage Vconst.

The intensity of the constant voltage Vconst present at the gate connection of the n-channel MOSFET transistor 101 is selected such that it corresponds to the above-mentioned predetermined desired value for the threshold voltage Vth,targ. In this case, the comparator 110 compares—instead the gate source voltage Vgs—the drain source voltage Vds (voltage at the line 102) with a reference voltage fb_ref (voltage at the line 109), and the difference between the reference voltage fb_ref and the drain source voltage Vds is drawn towards Zero by the regulating circuit formed by the comparator 110, the charge pump 114, and the n-channel MOSFET transistor 101.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for regulating the threshold value of a transistor, comprising:
    a circuit to modify a voltage applied at a bulk connection of the transistor in a first temperature range, and not modifying the voltage applied at the bulk connection in a second temperature range such that the threshold voltage of the transistor is temperature-dependent in the second temperature range and is substantially temperature-independent in the first temperature range.

2. The device according to claim 1, wherein the circuit comprises a second transistor that is connected as a diode.

3. The device according to claim 1, wherein the circuit comprises a comparator.

4. The device according to claim 3, wherein the circuit comprises a charge pump controlled by the comparator.

5. The device according to claim 3, wherein the comparator is configured such that it compares a gate source voltage of a second transistor that is connected as a diode with a reference voltage.

6. The device according to claim 5, wherein the comparator is configured such that, depending on the result of the comparison of the gate source voltage with the reference voltage, the charge pump is activated or deactivated.

7. The device according to claim 4, wherein a voltage applied at a bulk connection of a second transistor that is connected as a diode is modified by the charge pump.

8. The device according to claim 7, wherein the voltage applied at the bulk connection of the transistor is modified simultaneously by the charge pump.

9. The device according to claim 1, wherein the transistor is a field effect transistor.

10. The device according to claim 1, wherein the transistor is a transistor of a sense amplifier of a semiconductor memory device.

11. The device according to claim 2, wherein the transistor that is connected as a diode is a field effect transistor.

12. The device according to claim 1, wherein the circuit comprises a second transistor at the gate connection of which there is present a constant voltage.

13. The device according to claim 12, wherein the intensity of the constant voltage corresponds approximately to the desired intensity of the threshold voltage.

14. The device according to claim 12, wherein the circuit comprises a comparator that is configured such that it compares a drain source voltage of the transistor at the gate connection of which there is present the constant voltage with a reference voltage.

15. A method for regulating the threshold voltage of a transistor, the method comprises:
    modifying the voltage applied at a bulk connection of the transistor in a first temperature range, and not modifying the voltage applied at the bulk connection in a second temperature range such that the threshold voltage of the transistor is substantially temperature-dependent in the second temperature range and is substantially temperature-independent in the first temperature range.

16. The method according to claim 15, the method additionally comprising: comparing a gate source voltage of a second transistor that is connected as a diode with a reference voltage.

17. The method according to claim 16, the method additionally comprising:
activating or deactivating a charge pump, depending on the result of the comparison of the gate source voltage with the reference voltage.

18. The method according to claim 17, the method additionally comprising:
modifying a voltage applied at a bulk connection of the transistor that is connected as a diode by the charge pump.

19. The method according to claim 18, wherein the voltage applied at the bulk connection of the transistor is simultaneously modified by the charge pump.

20. The method according to claim 19, wherein, for regulating the threshold voltage of a further transistor, the charge pump simultaneously modifies a voltage applied at a bulk connection of the further transistor.

21. A device comprising:
a transistor; and
means for modifying a voltage applied at a bulk connection of the transistor in a first temperature range, and not modifying the voltage applied at the bulk connection in a second temperature range such that the threshold voltage of the transistor is temperature-dependent in the second temperature range and is substantially temperature-independent in the first temperature range for regulating the threshold value of a transistor.

22. The device according to claim 21, wherein the means comprises a second transistor that is connected as a diode.

23. The device according to claim 21, wherein the means comprises a comparator.

24. The device according to claim 23, wherein the means comprises a charge pump controlled by the comparator, wherein the comparator is configured such that it compares a gate source voltage of a second transistor that is connected as a diode with a reference voltage, and, wherein the comparator is configured such that, depending on the result of the comparison of the gate source voltage with the reference voltage, the charge pump is activated or deactivated.

25. The device according to claim 22, wherein a voltage applied at a bulk connection of the second transistor that is connected as a diode is modified by a charge pump.

26. A device comprising:
a semiconductor memory device having a sense amplifier including a transistor; and
a circuit to modify a voltage applied at a bulk connection of the transistor in a first temperature range, and not modifying the voltage applied at the bulk connection in a second temperature range such that the threshold voltage of the transistor is temperature-dependent in the second temperature range and is substantially temperature-independent in the first temperature range.

* * * * *